(12) United States Patent
Bailey

(10) Patent No.: US 8,317,524 B2
(45) Date of Patent: Nov. 27, 2012

(54) CONNECTOR AND ELECTRICAL TRACKS ASSEMBLY

(75) Inventor: John Michael Bailey, Thetford (GB)

(73) Assignee: Rolls-Royce PLC, London (GB)

(*) Notice: Subject to any disclaimer, the term of this patent is extended or adjusted under 35 U.S.C. 154(b) by 99 days.

(21) Appl. No.: 12/922,669

(22) PCT Filed: Mar. 26, 2009

(86) PCT No.: PCT/GB2009/050292
§ 371 (c)(1),
(2), (4) Date: Sep. 14, 2010

(87) PCT Pub. No.: WO2009/118561
PCT Pub. Date: Oct. 1, 2009

(65) Prior Publication Data
US 2011/0014803 A1  Jan. 20, 2011

(30) Foreign Application Priority Data
Mar. 28, 2008 (GB) ................... 0805674.9

(51) Int. Cl.
*H01R 12/00* (2006.01)
(52) U.S. Cl. .................... 439/67; 174/117 F
(58) Field of Classification Search ............ 439/67, 439/77; 174/117 F, 117 FF
See application file for complete search history.

(56) References Cited

U.S. PATENT DOCUMENTS

| | | | | |
|---|---|---|---|---|
| 2,963,538 A * | 12/1960 | Dahlgren | ............ | 174/268 |
| 3,086,071 A | 4/1963 | Preston | | |
| 3,168,617 A | 2/1965 | Richter | | |
| 5,194,010 A * | 3/1993 | Dambach et al. | ............ | 439/79 |
| 5,337,202 A * | 8/1994 | Jabbarai et al. | ............ | 360/97.11 |
| 5,371,324 A | 12/1994 | Kanno et al. | | |
| 6,049,041 A * | 4/2000 | Yoshioka et al. | ....... | 174/117 FF |
| 6,419,289 B1 | 7/2002 | Batten et al. | | |
| 6,521,838 B2 * | 2/2003 | Yamanobe et al. | ........ | 174/117 F |
| 6,707,006 B1 | 3/2004 | Myers | | |
| 6,971,650 B2 | 12/2005 | Marelja | | |
| 7,309,240 B2 * | 12/2007 | Horikiri et al. | ............ | 439/77 |
| 7,364,440 B2 * | 4/2008 | Gobron et al. | ............ | 439/77 |
| 2002/0046870 A1 | 4/2002 | Zein et al. | | |
| 2002/0170740 A1 | 11/2002 | Yamanobe et al. | | |
| 2003/0029628 A1 | 2/2003 | Uttinger et al. | | |

(Continued)

FOREIGN PATENT DOCUMENTS

DE       3 524 516       1/1987

(Continued)

OTHER PUBLICATIONS

International Search Report for International Application No. PCT/GB2009/050292, mailed Jul. 17, 2009.

*Primary Examiner* — Thanh Tam Le
(74) *Attorney, Agent, or Firm* — Oliff & Berridge, PLC

(57) ABSTRACT

A connector and electrical tracks assembly comprises a connector with a plurality of electrical contacts; said connector being connectable to a further connector at a first extremity; said connector being connectable at a second extremity to a circuit board portion with a plurality of electrical tracks; wherein a circuit board portion is located between a first layer of plastic thermosetting composite material of fiber and filler and a second layer of plastic thermosetting composite material of fiber and filler.

18 Claims, 4 Drawing Sheets

U.S. PATENT DOCUMENTS

| | | |
|---|---|---|
| 2004/0069525 A1 | 4/2004 | Reibel et al. |
| 2006/0060690 A1 | 3/2006 | Aisenbrey |
| 2006/0090924 A1 | 5/2006 | Reibel et al. |

FOREIGN PATENT DOCUMENTS

| | | |
|---|---|---|
| DE | 299 17 502 | 2/2000 |
| DE | 103 08 759 | 9/2004 |
| EP | 0 208 138 | 1/1987 |
| EP | 0 376 131 | 7/1990 |
| EP | 1 026 019 | 8/2000 |
| EP | 1 376 618 | 1/2004 |
| EP | 1 506 553 | 2/2005 |
| FR | 1443943 | 3/1965 |
| GB | 1104098 | 3/1965 |
| GB | 1 226 203 | 3/1971 |
| GB | 1 287 639 | 9/1972 |
| GB | 2 227 356 | 7/1990 |
| GB | 2 440 698 A | 2/2008 |
| JP | 8-130048 | 5/1996 |
| JP | 9-306261 | 11/1997 |
| JP | 11-83004 | 3/1999 |
| JP | 2001-43743 | 2/2001 |
| JP | 2007-088009 | 4/2007 |
| JP | 2008-130048 | 6/2008 |
| NL | 1012154 | 11/2000 |
| WO | WO 99/11492 | 3/1999 |
| WO | WO 01/98112 A1 | 12/2001 |
| WO | WO 03/098642 | 11/2003 |
| WO | WO2007/083102 | 7/2007 |
| WO | WO 2007/083102 | 7/2007 |

\* cited by examiner

CONNECTOR AND ELECTRICAL TRACKS ASSEMBLY

FIELD OF THE INVENTION

The invention relates to assemblies of connectors and electrical tracks. Such assemblies may be used for in-vehicle wiring.

The kind of vehicle envisaged may be selected from a wide range of vehicles from military vehicles such as tanks, to sport motors, rail, ice, air, water, and snow going vehicles.

BACKGROUND TO THE INVENTION AND PRIOR ART KNOWN TO THE APPLICANT(S)

The closest prior art known to the applicant is the applicant's own prior published patent applications: WO2007083102 and GB2440698.

JP08130048 and JP2007088009 are prior published applications.

SUMMARY OF THE INVENTION

In a first broad independent aspect, the invention provides a connector and electrical tracks assembly comprising a connector with a plurality of electrical contacts; said connector being connectable to a further connector at a first extremity; said connector being connectable at a second extremity to a circuit board portion with a plurality of electrical tracks; wherein a circuit board portion is located between a first layer of plastic thermosetting composite material of fibre and filler and a second layer of plastic thermosetting composite material of fibre and filler.

This configuration is particularly advantageous because it allows communication through the electrical tracks to be both durable in order to withstand vibration, impact and other mechanical forces of stress/strain to a greater extent than it would otherwise be possible. It also allows the circuit board to be an integral part of the assembly without necessarily incorporating separate means for immobilisation. It also has the advantage of being able to be readily formed into a generally flat structure between connectors in order to fit in confined spaces. It also reverses conventional thinking since the combination of plastic thermosetting composite material with a circuit board would not be considered by the skilled person in order to improve the properties of a connector and electrical tracks assembly particularly when the composite material has electrical conductive properties.

In a subsidiary aspect, the invention provides a circuit board which is relatively flexible. This allows the component to be fitted around complex shaped objects which are often found in vehicles.

In a further subsidiary aspect, said flexible circuit board incorporates an array of contacts corresponding to a plurality of said connector contacts and a relatively rigid layer is provided between said flexible circuit board's array and one of said plastic thermosetting composite material layers. This allows strains in the flexible board to be reduced in order to avoid premature failure when the flexible board is flexed into position prior to then being immobilised between hardened thermoset composite material layers. It avoids disruptions in the signal transmission which would otherwise arise in a bent flexible board immobilised as part of a hardened assembly of composite material layers on their own.

In a further subsidiary aspect, said rigid layer is located between said flexible circuit board's array and said connector's second extremity. This is particularly advantageous because it allows the rigid layer to fill a gap located in the connector's second extremity.

In a further subsidiary aspect, said connector's second extremity incorporates a number of pins at said second extremity and said layer substantially fills any gap between the pins and said flexible circuit board's array. This is particularly advantageous as it prevents filler running into the area of the connector which is embedded. It also substantially prevents the formation of weak points so that the concentration of filter is substantially homogenous throughout the composite layers.

In a further subsidiary aspect, said flexible circuit board incorporates an array of contacts corresponding to a plurality of said connector contacts and the relatively rigid layers located between said flexible circuit board's array and an outer most layer of plastic thermosetting composite material. This configuration reduces the strain which would otherwise be present once the flexible circuit board would be immobilised in a bent position.

In a further subsidiary aspect, two relatively rigid layers are provided which are located on either side of said flexible circuit board's array. This configuration further improves the reduction of stress/strain in order to allow the board to be immobilised in a bent configuration to suit particular fitting around or within a vehicle's component.

In a further subsidiary aspect, an electrically insulating layer is provided over said circuit board's tracks. This configuration is particularly advantageous because it allows interference free communication to be achieved within the envelope of plastic thermosetting composite material.

In a further subsidiary aspect, said insulating layer is of glass. This configuration is particularly advantageous since it allows the tracks to be protected in an improved manner and to allow these tracks to be visible through the glass layer whilst providing a particularly stable compound relative to the composite material layers.

In a further subsidiary aspect, said assembly incorporates a first array of electrical tracks located on a flexible circuit board in a flat configuration and a second array of electrical tracks in the form of sheathed wires in a flat configuration; said first array and said second array being located side by side in order to form a substantially flat configuration. This configuration allows a substantially flat configuration to be obtained which has the advantages of being able to fit in confined spaces. It also allows the assembly to achieve both electrical signal communication and electrical power transmission with minimal or no interference between the electrical power lines and the signal tracks.

In a further subsidiary aspect, said flexible circuit board incorporates one or more relatively rigid portions. Rigid portions may for example take the form of a processor or other electrical component which may similarly be protected in an improved manner when embedded between the composite layers whilst the flexible portions allow the circuit board to adopt shapes and configurations to fit around vehicle components or other complex shapes.

In a further subsidiary aspect, said one or more relatively rigid layers are formed of circuit board material (PCB) without any tracks. This material has been found to be particularly suited to mechanically and electrically separate the pins of the extremity of the connector to which it would be connected.

In a second broad independent aspect, the invention provides a method of producing a connector and electrical tracks assembly, comprising the steps of:

selecting a circuit board with a plurality of electrical tracks;

selecting at least two layers of plastic thermosetting composite material of fibre and filler;

placing said circuit board between said two layers; and treating said assembly in order to harden said layers.

In a further subsidiary aspect, the step of selecting a flexible circuit board is also envisaged.

In a further subsidiary aspect, the method further comprises the step of selecting a plurality of sheathed wires and placing them between said layers. This allows the method to produce an assembly which is optimised for the communication of electrical signals whilst at the same time allowing electrical power to be communicated across the assembly.

In a further subsidiary aspect, the method comprises the step of placing said sheathed wires and said circuit board side by side in a substantially flat configuration. This configuration allows communication to occur with either no or only minimal cross-talk.

In a further subsidiary aspect, the method comprises the step of selecting one or more connectors and embedding at least one extremity of said connectors between said layers of thermosetting composite material. This configuration allows the connector and the circuit board to be packaged in an improved manner with greater resistance to mechanical stresses/strains which arise in use.

In a further subsidiary aspect, the method comprises the step of placing a pre-treatment rigid layer over a portion of said flexible circuit board. This configuration reduces the stress/strain for certain areas of the flexible circuit board in order to minimise stress/strain build up which could otherwise cause premature failure.

In a further subsidiary aspect, said connector incorporates a plurality of pins and a rigid layer is placed to fill the gaps around said pins. This allows the mechanical strength of the pins to be reinforced whilst at the same time preventing unwarranted voids to appear between the composite layers and the connector which would otherwise weaken the overall strength of the composite and create localised short circuits.

DETAILED DESCRIPTION OF THE FIGURES

Figure 1:
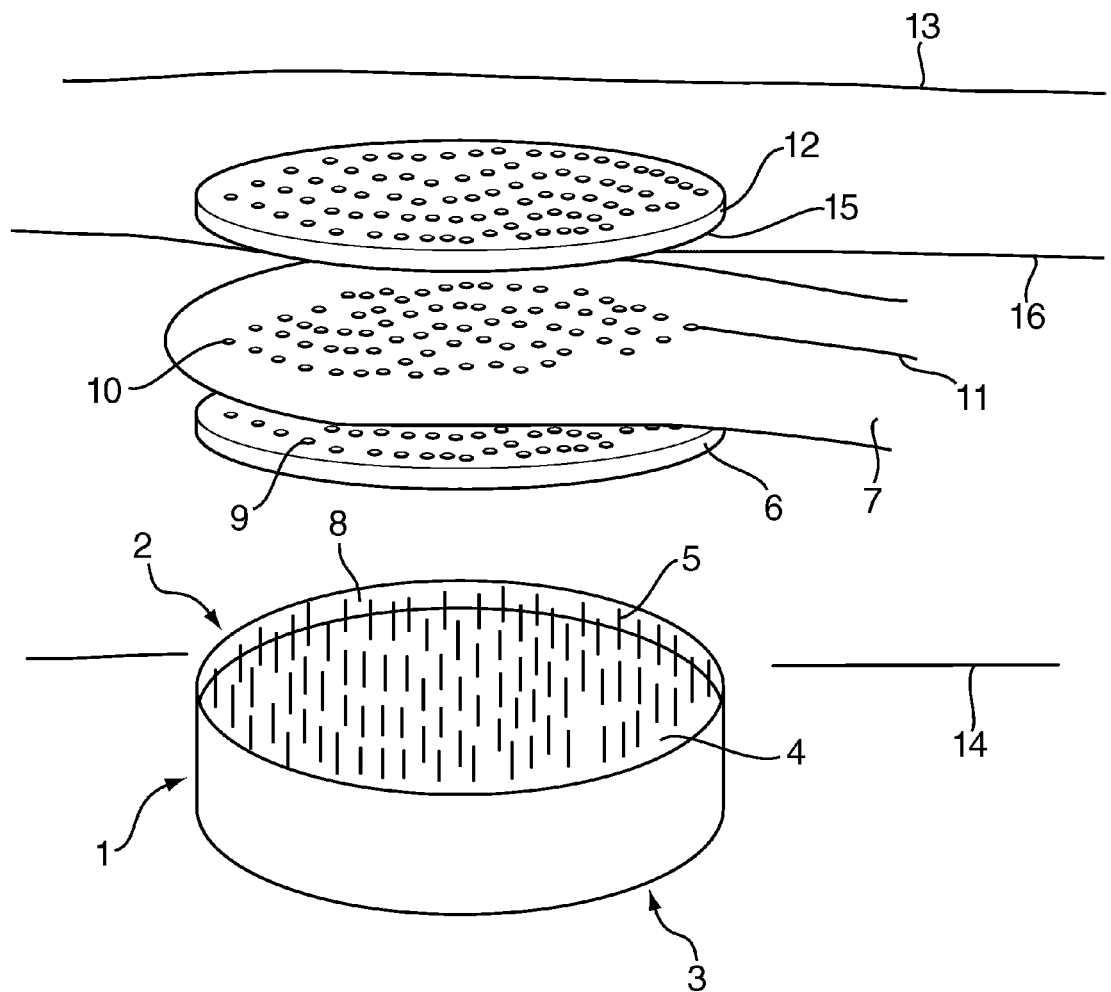
FIG. 1 shows an exploded perspective view of a portion of a connector and electrical tracks assembly.

FIG. 1 shows a connector portion 1 with a first extremity 2 and a second extremity 3. Extremity 3 may be shaped and configured for the attachment of a further connector of known kind. Extremity 2 incorporates an inner surface 4 from which a plurality of pins such as pin 5 extend which act as contact points.

A rigid disc or plate 6 which is rigid both pre-treatment and post-treatment relative to a flexible circuit board 7 which is relatively flexible pre-treatment and post-treatment (although in post-treatment use the flexible circuit board is immobilised between layers of composite material). The plate 6 is shaped and configured to fit against inner surface 4 and against the inner diameter 8 of connector extremity 2. Plate 6 is preferably made of a non-conductive substrate similar to that used for printed circuit boards (PCBs). The non-conductive substrate is preferably flame retardant. It may for example be of the flame retardant category four (FR-4). Plate 6 incorporates a number of holes such as hole 9 corresponding to individual pins 5. When plate 6 is placed against inner surface 4 and inner diameter 8, it fills substantially the entire region. Pins 5 protrude from plate 6 sufficiently to enter into contact with conductive annular members 10 of flexible circuit board 7. From each conductive annular member 10 is provided a number of electrically conductive tracks which are printed on the flexible circuit board. An exemplary track 11 is illustrated. Other conductive tracks have been omitted for simplicity and clarity. The board's non-conductive substrate is preferably of Polyimide or Polyester. The flexible board is intended to allow bending with a radius preferably comprised within the following range of 20 to 360 degrees.

The pins 5 are soldered to the annular contact members 10 which allow the flexible circuit board to be secured in position.

Covering the conductive tracks 11 there is provided an insulator layer which may be of glass. Above the glass layer a further non-conductive plate 12 is provided which may be of a similar shape and configuration as the previously described plate 6. It may incorporate a number of holes to accommodate any protruding pins and/or protruding solder. An adhesive may also be provided to secure plate 12 against the flexible circuit board 7. Illustrated as a straight line an outer layer 13 of composite material of fibre and filler is provided. Furthermore, a second outer layer 14 of composite material of filter and resin is provided in order to sandwich both the plates and flexible circuit board and immobilise these after a thermosetting treatment.

The composite material layers are relatively flexible prior to heat treatment and thereafter relatively rigid. The initial flexibility allows the sheets to be placed against a mould for thermosetting in a complex shape. The composite material may be in the form initially of a sheet of interwoven fibres with strands either extending in one direction or in a direction perpendicular to this direction. A cross-mesh may be employed. These resin and fibre compounds are readily available in many formats. A particularly preferred resin and fibre composite material may be of carbon fibre and resin. The natural stickiness of the resin assists in the flexible circuit board being placed in any appropriate configuration and thereafter thermoset in position. The composite material may be for example MTM57CF0300.

A number of conductor tracks are envisaged on the flexible circuit board which may be of the following material types: copper; tin-plated copper; silver-plated copper; nickel-plated copper; silver-plated copper alloy; and nickel-plated copper alloy.

The edges of plates 6 and 12 may preferably be chamfered. Particularly on the inner portions which would engage the flexible circuit board so as to minimise the build-up of stress/strain at what would otherwise constitute a sharp edge.

Figure 2:
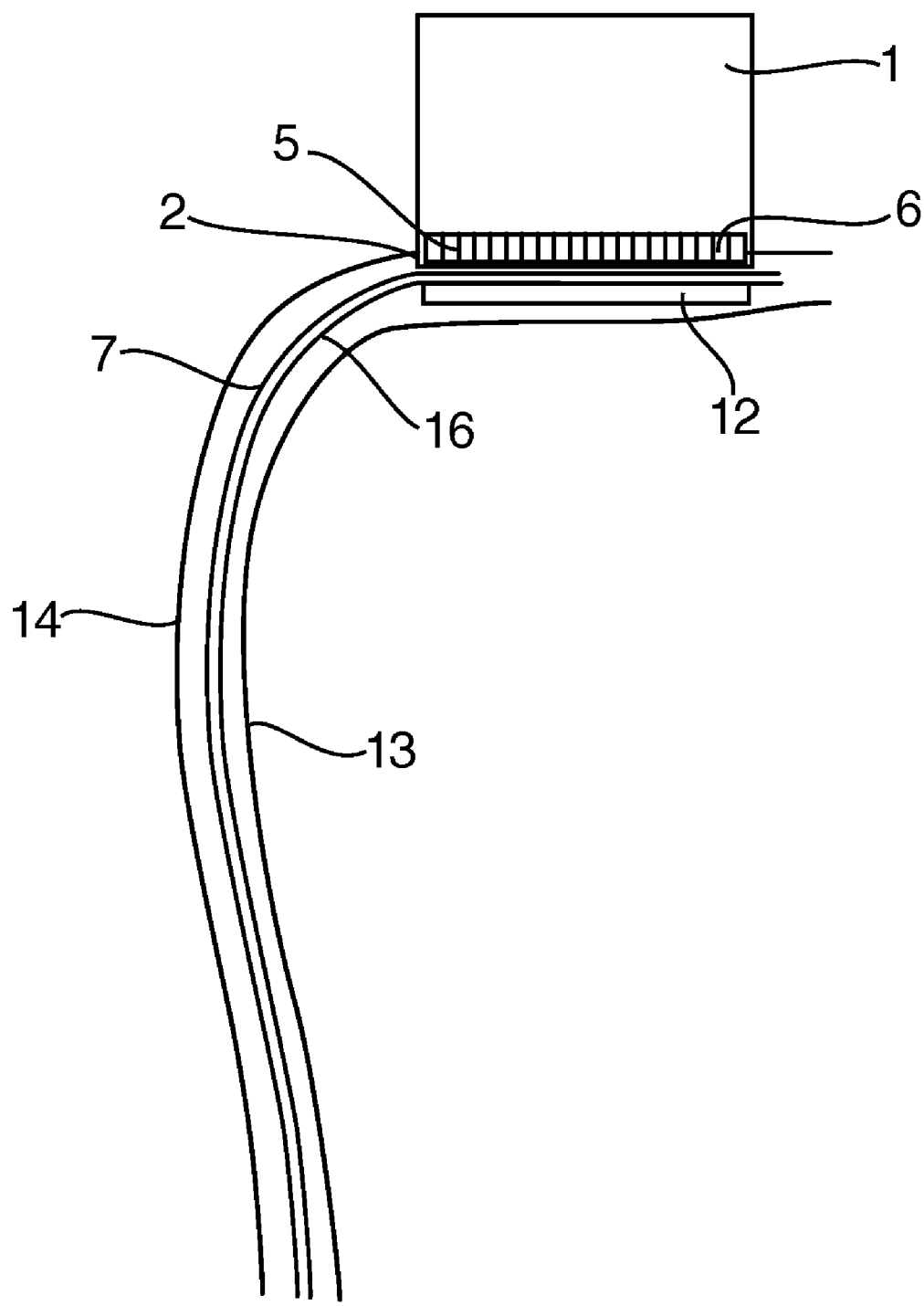
FIG. 2 shows a cross-sectional view of a portion of a connector and electrical tracks assembly.

FIG. 2 shows the components of FIG. 1 in an assembled form where gaps between layers have been inserted for clarity whilst the gaps in the assembled product are substantially non-existent. As can be seen, the flexible circuit board may be bent and secured in the bent position through the thermosetting process. As can be seen in FIG. 2, the extremity 2 of connector 1 is located inside the layers of composite material. In order to avoid gaps being present in the component, glass fibres may be added in appropriate locations.

Figure 3:
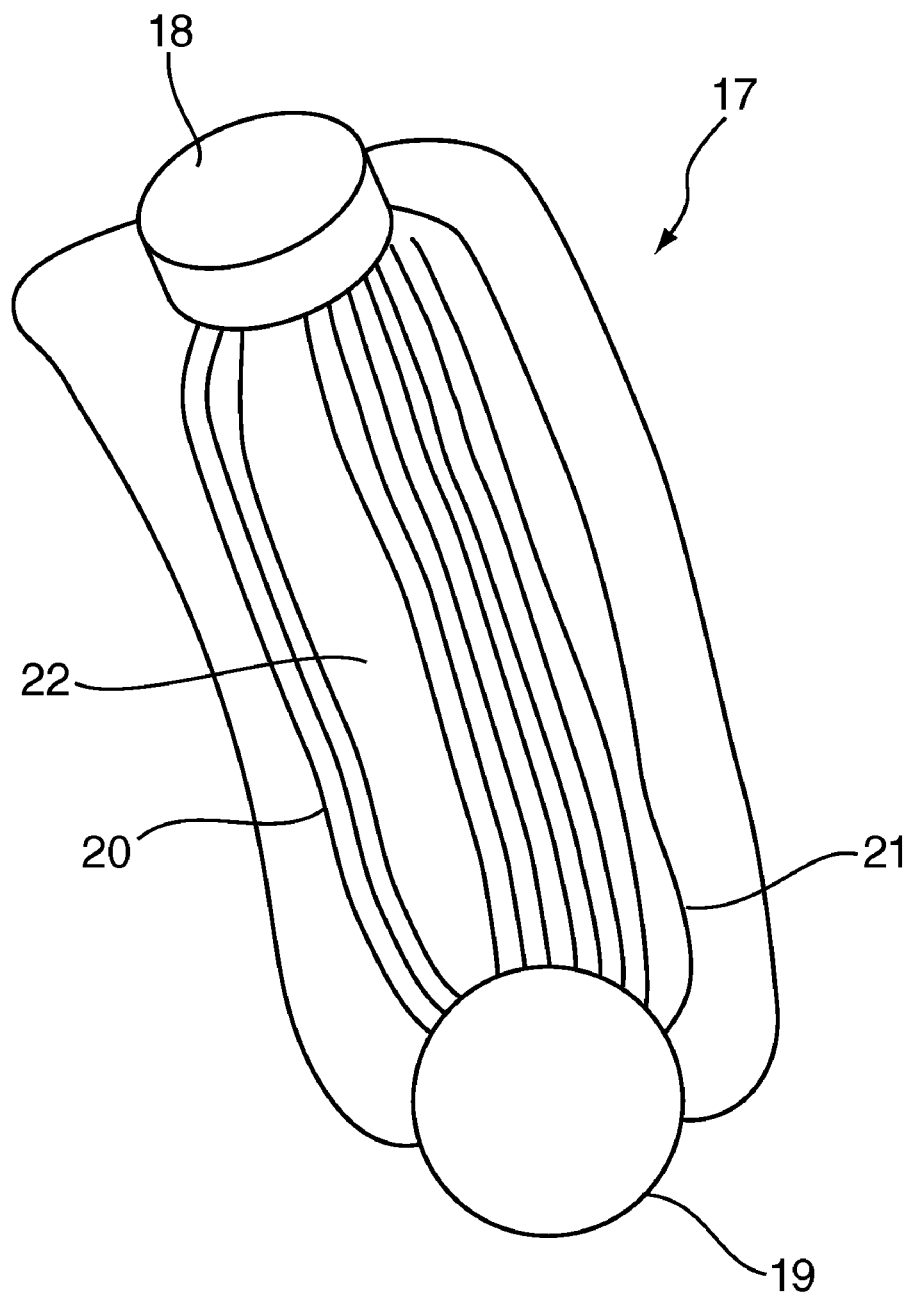
FIG. 3 shows a perspective view of a portion of a connector and electrical tracks assembly in accordance with a further embodiment of the invention.

FIG. 3 shows a connector and electrical tracks assembly 17 with a first connector 18 and a second connector 19. A number of sheathed electrical cables or tracks 20 are provided in a first portion and a number of electrical signal tracks are provided on a substantially flexible circuit board 21. The sheathed electrical cables may at least in part be provided to convey electrical power between connectors whilst the tracks of the flexible circuit board are primarily provided to convey electrical signals. Layers of composite material are provided on either side of the first and second portion in order to allow the assembly to be thermoset as a substantially flat component. The electrical circuit board and the cables are located side by side with a gap 22 provided between the portions in order to avoid cross-talk. A layer of insulator may be provided over the circuit board tracks which need not be present over the cables since these already have their own insulator sheaths. Plates may also be provided in the connectors to fill any gap left between pins or other contact points which are embedded in the assembly and in order to reduce the build-up of stress/strain in the flexible circuit board and/or the cables.

The layers, wires and/or the circuit board may be placed on or in a mould which imposes its shape on the assembly. In order to improve the smoothness of the surface finish a glass or aluminium mould is preferred. An aluminium mould with a surface with a curve will allow the laminate to adopt the shape of that curve following the heat treatment. A station may be provided for the extraction of air by vacuum between the layers prior to their placement in an autoclave oven for pressurised (preferably in a vacuum) heat treatment. The temperature of the heat treatment is selected in order to strike a good balance between economy and rapidity of heat treatment. For this application however heat treatment of approximately 100 to 125 degrees Celsius is preferred. After cooling, the assembly is thermoset as the combination of flexible circuit board and composite material becomes a relatively rigid structure with the geometry set by the mould.

The rigid structure can then be fitted with mating connectors for incorporation into a vehicle as appropriate. The method also incorporates the step of embedding a portion of a connector between layers of thermosetting composite material.

The method also envisages the step of incorporating one or more rigid layers which are non-conductive to fill gaps around the pins of a connector.

It is also envisaged that a plate is selected which fits in a corresponding cavity in one extremity of the connector and which is secured in place when the flexible circuit board is soldered to the connector pins.

The method also envisages chamfering inner edges of plates in order to remove sharp edges against which the flexible circuit board is bent. It is also envisaged that the mould incorporates a barrier to prevent filler covering the entire connector during the treatment.

Instead of securing a flexible circuit board on its own, the invention also envisages potentially incorporating both electrical cables and a flexible printed circuit board.

A further embodiment of the invention envisages the provision of a flexible circuit board and a relatively rigid board sandwiched between composite layers. The flexible circuit board may be provided adjacent to a rigid board.

Figure 4:
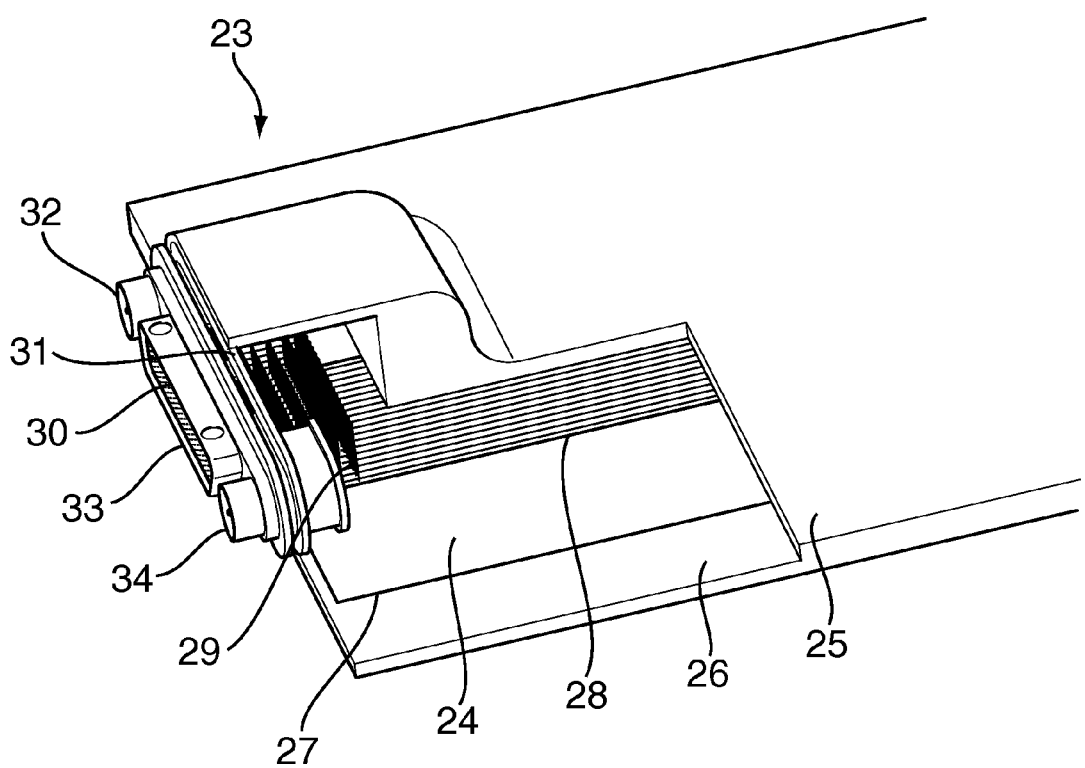
FIG. 4 shows a perspective view of a connector and electrical tracks assembly in accordance with a further embodiment of the invention.

FIG. 4 shows a portion 23 of a connector and electrical tracks assembly. A flexible circuit board 24 is sandwiched between two layers of composite material 25 and 26. The board is formed from an electrically isolating layer or substrate 27 on which electrical tracks 28 have been printed. A number of connecting pins 29 extend between the tracks and corresponding ports in connector 30. Connector 30 incorporates a rear portion 31 which is embedded between the upper and tower layers. Connector 30 incorporates a plurality of distinct receiving portions 32, 33 and 34. Furthermore, in order to strengthen the assembly against bending a number of portions of composite material layers may be oriented to resist bending for example a web extending at an angle (e.g.) perpendicular from the base surface of the assembly may be provided. Optionally, a spacer may be provided between the pins to prevent the filler from filling the spaces between the pins.

The invention claimed is:

1. A connector and electrical tracks assembly comprising a connector with a plurality of electrical contacts; said connector being connectable to a further connector at a first extremity; said connector being connectable at a second extremity to a circuit board portion with a plurality of electrical tracks; wherein said circuit board portion is located between a first layer of plastic thermosetting composite material of fibre and filler and a second layer of plastic thermosetting composite material of fibre and filler; and wherein an electrically isolating layer is provided over said circuit board's tracks.

2. An assembly according to claim 1, wherein said circuit board is flexible.

3. An assembly according to claim 2, wherein said flexible circuit board incorporates an array of contacts corresponding to a plurality of said connector contacts and a relatively rigid layer is provided between said flexible circuit board's array and one of said plastic thermosetting composite material layers.

4. An assembly according to claim 3, wherein said rigid layer is located between said flexible circuit board's array and said connector's second extremity.

5. An assembly according to claim 4, wherein said connector's second extremity incorporates a number of pins at said second extremity and said layer substantially fills any gap between the pins and said flexible circuit board's array.

6. An assembly according to claim 2, wherein said flexible circuit board incorporates an array of contacts corresponding to a plurality of said connector contacts and a relatively rigid layer is located between said flexible circuit board's array and an outermost layer of plastic thermosetting composite material.

7. An assembly according to claim 2, wherein two relatively rigid layers are provided which are located on either side of said flexible circuit board's array.

8. An assembly according to claim 1, wherein said isolating layer is of glass.

9. An assembly according to claim 1, wherein said assembly incorporates a first array of electrical tracks located on a flexible circuit board in a flat configuration and a second array of electrical tracks in the form of sheathed wires in a flat configuration; said first array and said second array being located side by side in order to form a substantially flat configuration.

10. An assembly according to claim 2, wherein said flexible circuit board incorporates at least one relatively rigid portion.

11. An assembly according to claim 3, wherein said at least one relatively rigid layer is formed of circuit board material (PCB) without any tracks.

12. A method of producing a connector and electrical tracks assembly, comprising the steps of:
   selecting a circuit board with a plurality of electrical tracks;
   selecting at least two layers of plastic thermosetting composite material of fibre and filler;
   providing an electrically isolating layer over said circuit board's tracks;
   placing said circuit board between said two layers; and
   treating said assembly in order to harden said layers.

13. A method according to claim 12, further comprising the step of selecting a flexible circuit board.

14. A method according to claim 12, further comprising the step of selecting a plurality of sheathed wires and placing them between said two layers.

15. A method according to claim 14, comprising the step of placing said sheathed wires and said circuit board side by side in substantially flat configuration.

16. A method according to claim 12, comprising the step of selecting at least one connector and embedding at least one extremity of said connector between said layers of thermosetting composite material.

17. A method according to claim 13, comprising the step of placing a pre-treatment rigid layer over a portion of said flexible circuit board.

18. A method according to claim 17, wherein said connector incorporates a plurality of pins and a rigid layer is placed to fill the gaps around said pins.

* * * * *